United States Patent

Bailleul et al.

Patent Number: 5,828,238
Date of Patent: *Oct. 27, 1998

[54] DIGITAL FREQUENCY DISCRIMINATOR

[75] Inventors: Patrick K. Bailleul, Whittier; Harold L. Zauss, Redondo Beach; Brent E. Adams, Los Angeles, all of Calif.

[73] Assignee: Raytheon Company, Lexington, Mass.

[*] Notice: This patent issued on a continued prosecution application filed under 37 CFR 1.53(d), and is subject to the twenty year patent term provisions of 35 U.S.C. 154(a)(2).

[21] Appl. No.: 738,452

[22] Filed: Oct. 30, 1996

[51] Int. Cl.⁶ .................................................. H04L 27/14
[52] U.S. Cl. ................................. 327/39; 327/1; 329/303
[58] Field of Search ..................................... 329/343, 336, 329/303; 327/1, 2, 3, 39, 40, 43, 47, 49, 31, 113, 12, 261, 276, 255, 558

[56] References Cited

U.S. PATENT DOCUMENTS 3,778,727  12/1973  Williams ..................................... 327/31
4,055,814  10/1977  Abraham et al. ............................ 327/3
5,053,649  10/1991  Johnson ....................................... 327/3

*Primary Examiner*—Dinh Le
*Attorney, Agent, or Firm*—Leonard A. Alkov; Glenn H. Lenzen, Jr.

[57] ABSTRACT

A frequency discriminator circuit that includes a signal shaping and power splitting circuit (20) responsive to a sinusoidal RF input signal for providing first and second substantially identical squarewave outputs having the same frequency as the sinusoidal RF signal, a digital delay line (19) responsive to the first squarewave output for providing a delayed replica of the first squarewave output, an exclusive OR gate (21) responsive to the second squarewave output and the delayed replica of the first squarewave output, low pass filters (23, 25) for averaging each of the inverted and non-inverted outputs of the exclusive OR gate, and a differential amplifier (27) for subtracting the outputs of the low pass filters from each other and providing an output indicative of the frequency of the RF input signal.

1 Claim, 1 Drawing Sheet

DIGITAL FREQUENCY DISCRIMINATOR

BACKGROUND OF THE INVENTION

The disclosed invention is directed generally to frequency discriminators, and more particularly to a digital frequency discriminator.

RF frequency discriminator circuits are employed in electronic warfare (EW) systems to detect the frequencies of received RF signals such as the RF signals emitted by enemy radar systems. Known frequency discriminator circuits employ an analog power splitter for receiving an RF input signal, a transmission line delay for providing a delayed replica of a first output of the power splitter, an analog mixer for mixing the delayed replica of the first output of the power splitter and a second output of the power splitter, and a low pass filter for removing the AC components from the output of the analog mixer.

Considerations with known delay line frequency discriminator circuits include large size of the components, a fixed delay and a corresponding fixed center frequency, and the need for manual tuning.

SUMMARY OF THE INVENTION

It would therefore be an advantage to provide a compact tunable delay line frequency discriminator.

The foregoing and other advantages are provided by the invention in a frequency discriminator circuit that includes a signal shaping and power splitting circuit responsive to a sinusoidal RF input signal for providing first and second substantially identical squarewave outputs having the same frequency as the sinusoidal RF signal, a digital delay line responsive to the first squarewave output for providing a delayed replica of the first squarewave output, a digital mixer responsive to the second squarewave output and the delayed replica of the first squarewave output for providing a digital mixer output, and a low pass filter circuit for averaging the output of the digital mixer to provide a DC signal that is indicative of the frequency of the RF input signal.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
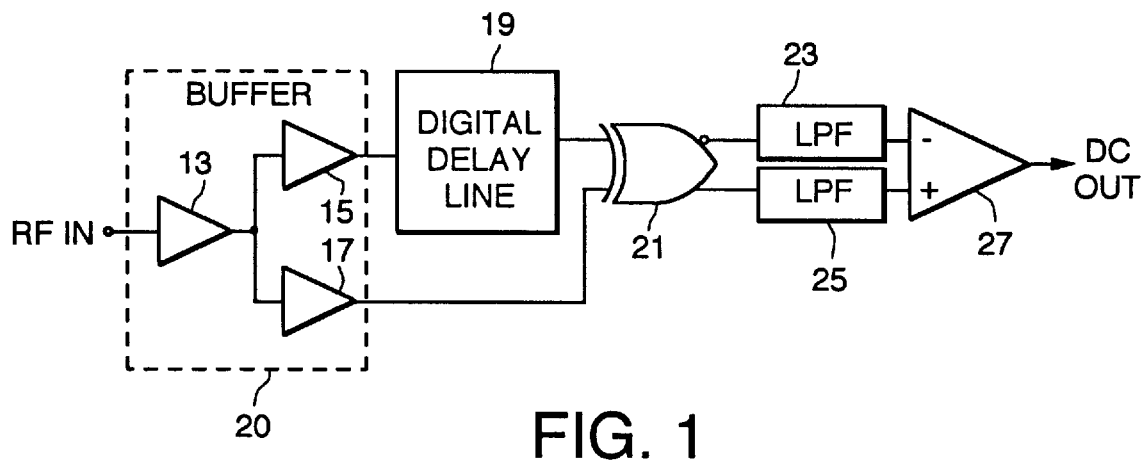
FIG. 1 is a functional block diagram of a digital frequency discriminator circuit in accordance with the invention.

In the following detailed description and in the several figures of the drawing, like elements are identified with like reference numerals.

The disclosed exemplary embodiment of the invention is based on the use of emitter coupled logic (ECL) which provides for higher processing speeds. It should be appreciated that the invention can be implemented with other forms of logic circuitry.

Referring now to FIG. 1, set forth therein is a functional block diagram of a digital delay line frequency discriminator in accordance with the invention which includes a conventional buffer 20 that receives an RF input signal and provides a pair of substantially identical outputs that comprise squarewave signals, each having the same frequency and zero crossings as the RF input signal. The buffer 20 includes an input amplifier 13 and first and second output amplifiers 15, 17, and effectively serves as a signal shaper and a signal splitter.

The output of the first output amplifier 15 of the buffer 20 is provided to the input of a programmable digital delay line 19, while the output of the second output amplifier 17 of the buffer 20 is provided as one input to a differential output exclusive OR gate 21. The output of the programmable digital delay line 19 is provided as the other input to the exclusive OR gate 21. Thus, the inputs to the exclusive OR gate are two squarewave signals of identical frequency but offset in phase. By way of illustrative example, the programmable digital delay line 19 can be implemented with a Motorola MC100E195 programmable delay chip.

The inverted output and the non-inverted output of the exclusive OR gate 21 are provided to respective analog low pass filters 23, 25. The outputs of the low pass filters 23, 25 are respectively provided to the non-inverting input and the inverting input of a differential amplifier 27 whose output is a DC signal that is indicative of the frequency of the RF input signal.

Overall, the exclusive OR gate 21 acts as a mixer, the low pass filters 23, 25 integrate the differential outputs of the exclusive OR gate 21, and the differential amplifier 27 performs a differential to single-ended conversion to provide the final DC output voltage of the frequency discriminator.

In use, the delay $\tau$ provided by the programmable digital delay line 19 is selected so that it provides a phase shift of 90 degrees at the desired center frequency of the discriminator. The output of the exclusive OR gate 21 then comprises a series of pulses of width $\tau$ and having a period equal to one-half the period of the RF input signal. These pulses are integrated by the low pass filters 23, 25 to obtain their average or DC value. At the center frequency, as determined by the selected delay of the programmable digital delay line 19, the pulse train output of the exclusive OR gate 21 will have twice the frequency of the RF input signal and a duty cycle of 50 percent. The DC output voltage at the center frequency is thus zero, since the average value of a square wave having a 50 percent duty cycle and no DC offset is zero. It should be appreciated that the differential amplifier 27 removes the inherent DC offset of the ECL signals and increases the average value of the pulse train output of the exclusive OR gate 21.

At frequencies greater than the center frequency, the pulse width of the exclusive OR gate output remains the same, but the period decreases. Therefore, the average value of the exclusive OR output pulses increases and the DC output voltage increases accordingly. Conversely, at frequencies lower than the center frequency, the pulse width of the exclusive OR output remains the same, but the period increases. Therefore, the average value of the exclusive OR output pulses decreases and the DC output voltage decreases accordingly.

The actual value of the output DC voltage for a given frequency is determined by the voltage swing at the output of the exclusive OR gate 21, the gain of the differential amplifier 27, and the amount of the delay $\tau$ selected for the programmable digital delay line 19. Therefore, for a fixed voltage swing and amplifier gain, the DC output voltage and therefore the slope of the transfer function can be adjusted by changing the delay $\tau$.

Figure 2:
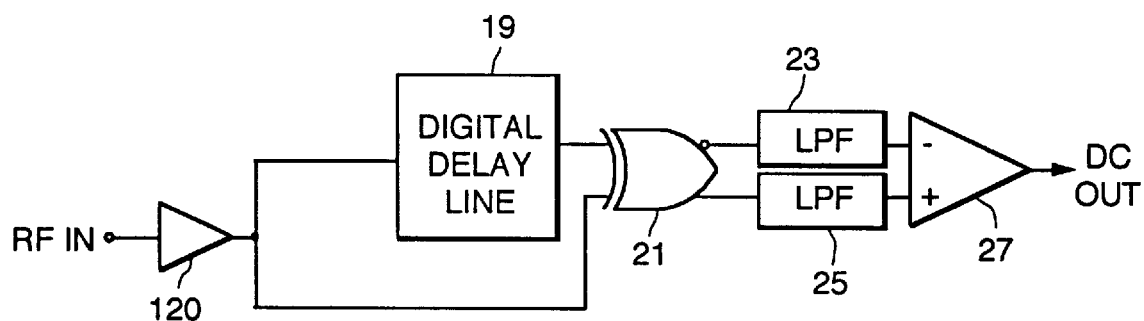
FIG. 2 is a functional block diagram of a further digital frequency discriminator circuit in accordance with the invention.

Referring now to FIG. 2, set forth therein is a functional block diagram of a further implementation of a digital delay line frequency discriminator in accordance with the invention which is substantially similar to the frequency discriminator of FIG. 1, except as to the use of a conventional buffer 120 that provides a single output that is connected to both the input to the programmable digital delay line and the exclusive OR gate 21.

The foregoing has thus been a disclosure of a frequency discriminator circuit that is compact and advantageously implemented as a hybrid or a custom application specific integrated circuit. The disclosed discriminator circuit is programmable, which allows for variation of center frequency and slope, as well as automatic tuning which reduces manufacturing labor cost. The disclosed discriminator circuit also avoids hand wound transformers usually associated with mixers of the prior art, which advantageously reduces material cost. Further, the disclosed discriminator circuit has an inherently linear transfer function, in contrast to the sinusoidal transfer function of the prior art frequency discriminators, which simplifies its use in receiver systems.

Although the foregoing has been a description and illustration of specific embodiments of the invention, various modifications and changes thereto can be made by persons skilled in the art without departing from the scope and spirit of the invention as defined by the following claims.

What is claimed is:

1. A digital frequency discriminator comprising:

a buffer responsive to a sinusoidal RF input signal having a predetermined center frequency with a predetermined period for providing a squarewave output signal having the same frequency as the sinusoidal RF signal;

a programmable digital delay line responsive to said squarewave output signal for generating a delayed signal replica of said squarewave output signal, at a predetermined delay $\tau$ by shifting said predetermined center frequency by 90 degrees;

an exclusive OR gate, responsive to said output signal of said programmable digital delay line and to said squarewave output signal for providing a different output signal comprising an inverted output signal and non-inverted output signal which comprises a series of pulses of width $\tau$ and having a period of equal to one-half the period of the predetermined period of said sinusoidal RF input signal; and first and second low pass filters for filtering said inverted output signal and said non-inverted output of said exclusive OR gate, respectively; and a differential amplifier coupled to said first and second low pass filters for providing a DC output voltage indicative of said central frequency of said sinusoidal RF signal;

wherein said center frequency of the discriminator determined by said predetermined delay $\tau$ of said programmable digital delay line, said series of pulses output from said exclusive OR gate has twice the predetermined center frequency of said sinusoidal RF input signal and a duty cycle of 50 percent, and the DC output voltage at said center frequency is zero and said DC output voltage is adjusted by changing said predetermined delay $\tau$, wherein when sinusoidal RF input signal frequencies greater than said center frequency of the discriminator, said pulse width of the exclusive OR gate output signal remains the same and average value of the exclusive OR output pulses increased, and when said sinusoidal RF input signal frequencies lower than said center frequency of the discriminator the pulse width of the exclusive OR output signal remains the same and said average value of the exclusive OR gate output pulses decreased.

* * * * *